(12) United States Patent
Fujihara

(10) Patent No.: US 10,534,062 B2
(45) Date of Patent: Jan. 14, 2020

(54) DETERMINING METHOD AND DETERMINING APPARATUS

(71) Applicant: Panasonic Intellectual Property Management Co., Ltd., Osaka (JP)

(72) Inventor: Tadato Fujihara, Osaka (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 51 days.

(21) Appl. No.: 15/961,456

(22) Filed: Apr. 24, 2018

(65) Prior Publication Data

US 2018/0335499 A1    Nov. 22, 2018

(30) Foreign Application Priority Data

May 16, 2017    (JP) .................................. 2017-097320

(51) Int. Cl.
  *G01R 35/04*    (2006.01)
  *G01R 15/18*    (2006.01)
  *G01R 22/06*    (2006.01)
(52) U.S. Cl.
  CPC ............. *G01R 35/04* (2013.01); *G01R 15/18* (2013.01); *G01R 22/068* (2013.01)

(58) Field of Classification Search
  CPC ....... G01R 35/04; G01R 15/18; G01R 22/068
  USPC ......... 324/74, 425, 434, 458, 600, 714, 723, 324/537, 120–142, 435, 76.11, 114, 500, 324/508, 764.01
  See application file for complete search history.

(56) References Cited

U.S. PATENT DOCUMENTS

2011/0153244 A1\*    6/2011    Rocha Alves, Jr. ........................ G01R 19/2513 702/64
2014/0183954 A1\*    7/2014    Yoshida .................... H02J 3/46 307/59

FOREIGN PATENT DOCUMENTS

JP    2004-138494    5/2004

\* cited by examiner

*Primary Examiner* — Melissa J Koval
*Assistant Examiner* — Trung Nguyen
(74) *Attorney, Agent, or Firm* — Greenblum & Bernstein, P.L.C.

(57) ABSTRACT

A determining method includes: acquiring a measured value for an amount of electric power consumed by the load, the measured value being measured by a watt-hour meter; and determining whether a setting set in a watt-hour meter, the setting according to a current transformation ratio of a current transformer, is appropriate, according to a difference between a predicted value for an amount of electric power to be consumed by a load and the measured value for an amount of electric power consumed by the load.

9 Claims, 15 Drawing Sheets

FIG. 3

| IDENTIFICATION OF WATT-HOUR METER | DATE AND TIME OF MEASUREMENT | TOTAL AMOUNT OF ELECTRIC POWER [kWh] |
|---|---|---|
| WATT-HOUR METER 1 | JANUARY 1, 2017 AT 0 O'CLOCK | 100 |
| WATT-HOUR METER 1 | JANUARY 1, 2017 AT 1 O'CLOCK | 200 |
| WATT-HOUR METER 1 | JANUARY 1, 2017 AT 2 O'CLOCK | 300 |
| WATT-HOUR METER 2 | JANUARY 1, 2017 AT 0 O'CLOCK | 100 |
| WATT-HOUR METER 2 | JANUARY 1, 2017 AT 1 O'CLOCK | 200 |
| WATT-HOUR METER 2 | JANUARY 1, 2017 AT 2 O'CLOCK | 100 |
| ... | ... | ... |

| TYPE OF WATT-HOUR METER | TYPE OF CT |
|---|---|
| A | CT1 (CURRENT TRANSFORMATION RATIO: 2000:1) |
| | CT2 (CURRENT TRANSFORMATION RATIO: 3000:1) |
| B | CT3 (CURRENT TRANSFORMATION RATIO: 1000:1) |
| | CT4 (CURRENT TRANSFORMATION RATIO: 2000:1) |
| | CT5 (CURRENT TRANSFORMATION RATIO: 4000:1) |
| ⋮ | ⋮ |

(b)

| WATT-HOUR METER | TYPE OF LOAD |
|---|---|
| WATT-HOUR METER 1 | COOLING TYPE (FREEZING MACHINE) |
| WATT-HOUR METER 2 | COOLING TYPE (FREEZING MACHINE) |
| WATT-HOUR METER 3 | COOLING TYPE (FREEZING MACHINE) |
| ⋮ | ⋮ |

(c)

| TYPE OF LOAD | NAME OF CALCULATION | STANDARD CALCULATION ERROR RATIO IN CALCULATION METHOD |
|---|---|---|
| COOLING TYPE (FREEZING MACHINE) | FREEZING MACHINE SIMULATION | ±10% |
| AIR-CONDITIONING TYPE | AIR-CONDITIONING SIMULATION | ±10% |
| LIGHTING TYPE | LIGHTING SIMULATION | ±2% |
| ⋮ | ⋮ | ⋮ |

(d)

| WATT-HOUR METER | CALCULATION ERROR RATIO |
|---|---|
| WATT-HOUR METER 1 | 8% |
| WATT-HOUR METER 2 | 2% |
| WATT-HOUR METER 3 | 50% |
| WATT-HOUR METER 4 | 7% |
| WATT-HOUR METER 5 | 1% |
| WATT-HOUR METER 6 | 2% |
| ⋮ | ⋮ |

(e)

| TYPE OF WATT-HOUR METER | CALCULATION ERROR RATIO |
|---|---|
| A | 50% |
| | −33% |
| B | 100% |
| | 300% |
| | −50% |
| | −75% |
| ⋮ | ⋮ |

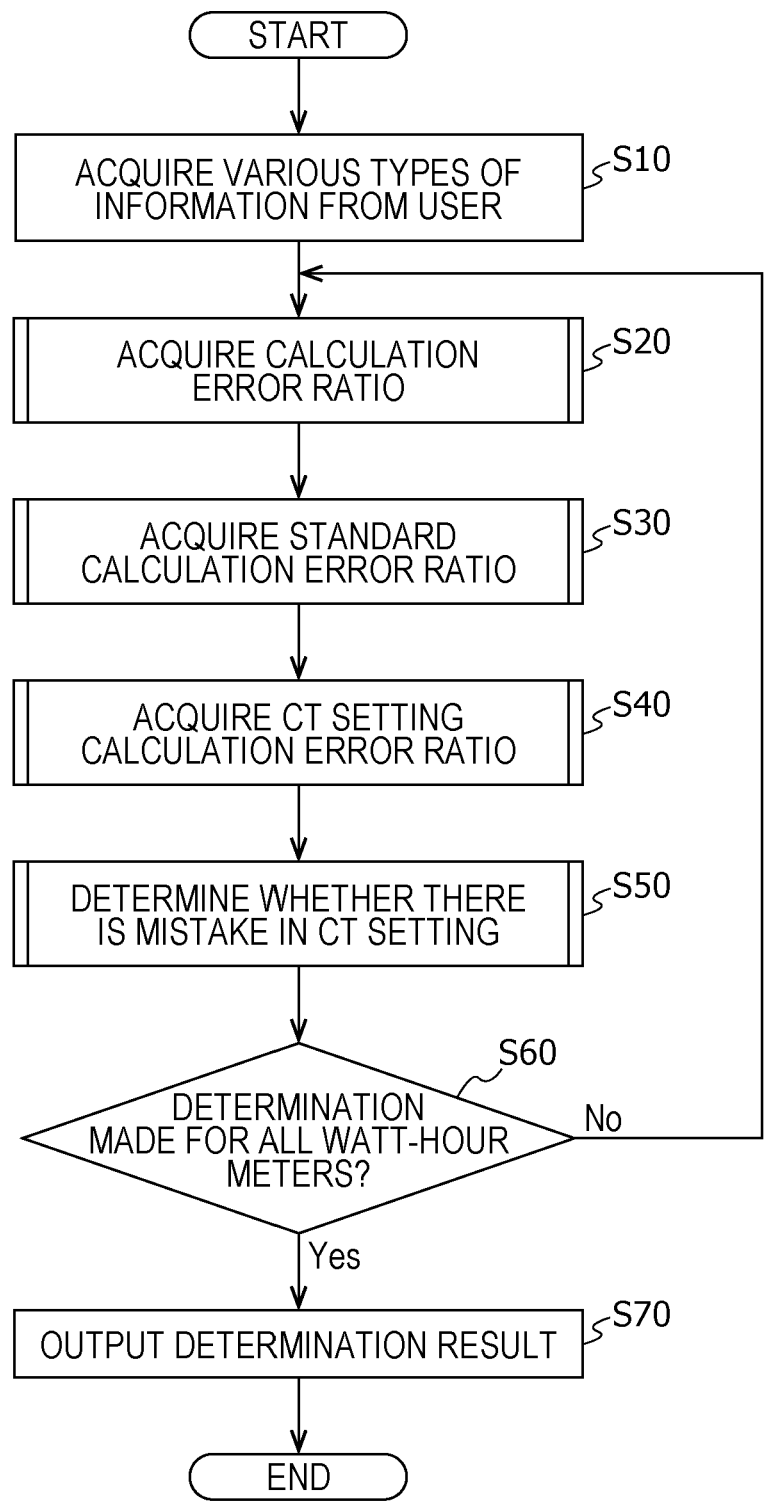

FIG. 6

1) INPUT OF WATT-HOUR METER INFORMATION
   · TYPE: TYPE A
   · NUMBER OF WATT-HOUR METERS: 12

2) TYPES OF PREPARED CT'S
   · WATT-HOUR METER 1: CT1
   · WATT-HOUR METER 2: CT2
   · WATT-HOUR METER 3: CT1
         ⋮
   · WATT-HOUR METER 7: CT1
         ⋮
   · WATT-HOUR METER 11: CT2
   · WATT-HOUR METER 12: CT2

3) INPUT OF LOAD
   · WATT-HOUR METER 1: COOLING TYPE (FREEZING MACHINE)
   · WATT-HOUR METER 2: COOLING TYPE (FREEZING MACHINE)
   · WATT-HOUR METER 3: COOLING TYPE (FREEZING MACHINE)
         ⋮
   · WATT-HOUR METER 12: COOLING TYPE (FREEZING MACHINE)

4) INPUT OF DIAGNOSIS PERIOD (CALCULATION PERIOD)
   · JANUARY 2017 (ONE MONTH)

FIG. 11

| TYPE OF WATT-HOUR METER | SETTABLE CT TYPE | TYPE OF PREPARED CT | TYPE OF CT INCORRECTLY SET IN WATT-HOUR METER | NUMBER OF COMBINATIONS OF CT SETTING MISTAKES |
|---|---|---|---|---|
| A | CT1 AND CT2 (TWO TYPES) | CT1 | CT2 | 2 |
| | | CT2 | CT1 | |
| B | CT3, CT4, AND CT5 (THREE TYPES) | CT3 | CT4 OR CT5 | 6 |
| | | CT4 | CT3 OR CT5 | |
| | | CT5 | CT3 OR CT4 | |

FIG. 12

| TYPE OF PREPARED CT | CT TYPE SET IN WATT-HOUR METER | CALCULATION OF CORRECT AMOUNT OF ELECTRIC POWER | CT SETTING CALCULATION ERROR RATIO |
|---|---|---|---|
| CT1 (CURRENT TRANSFORMATION RATIO: 2000:1) | CT2 (CURRENT TRANSFORMATION RATIO: 3000:1) | CORRECT AMOUNT OF ELECTRIC POWER = MEASURED VALUE/3000×2000 = MEASURED VALUE×0.67 | −33% |
| CT2 (CURRENT TRANSFORMATION RATIO: 3000:1) | CT1 (CURRENT TRANSFORMATION RATIO: 2000:1) | CORRECT AMOUNT OF ELECTRIC POWER = MEASURED VALUE/2000×3000 = MEASURED VALUE×1.5 | 50% |

FIG. 16

■ DIAGNOSTIC RESULT

· WATT-HOUR METER 1: ○
· WATT-HOUR METER 2: × CT SETTING IS INCORRECT. (CHANGE TO SETTING FOR CT2.)
· WATT-HOUR METER 3: ○
...
· WATT-HOUR METER 7: × CT SETTING IS INCORRECT. (CHANGE TO SETTING FOR CT1.)
· WATT-HOUR METER 8: ○
...
· WATT-HOUR METER 11: × CT SETTING IS INCORRECT. (CHANGE TO SETTING FOR CT2.)
· WATT-HOUR METER 12: ○

DETERMINING METHOD AND DETERMINING APPARATUS

BACKGROUND

1. Technical Field

The present disclosure relates to a determining method and determining apparatus by which, in a watt-hour meter that uses a Current Transformer (CT), it is determined whether a CT setting is appropriate that is set in the watt-hour meter when, for example, it is installed.

2. Description of the Related Art

A conventional technology is proposed that determines whether there is an installation mistake in a watt-hour meter that uses a CT (see, for example, Japanese Unexamined Patent Application Publication No. 2004-138494). In the technology disclosed in Japanese Unexamined Patent Application Publication No. 2004-138494, the phase sequence of a voltage of multiphase power supplied from the outside is detected to determine whether there is an installation mistake in wiring performed for voltage measurement, and the current direction of the multiphase power is also detected to determine whether there is an installation mistake in the direction in which the CT has been disposed.

SUMMARY

In the installation of a watt-hour meter, a setting is entered into the watt-hour meter according to the current transformation ratio of a CT in use (this setting will sometimes be referred to as the CT setting). The worker manually enters a CT setting into the watt-hour meter, so an input mistake may occur.

However, the technology in Japanese Unexamined Patent Application Publication No. 2004-138494 cannot determine whether the CT setting is appropriate.

One non-limiting and exemplary embodiment provides a determining method and determining apparatus by which it can be determined whether a CT setting entered into a watt-hour meter is appropriate.

In one general aspect, the techniques disclosed here feature a determining method that includes: acquiring a measured value for an amount of electric power consumed by the load, the measured value being measured by a watt-hour meter; and determining whether a setting set in a watt-hour meter, the setting according to a current transformation ratio of a current transformer, is appropriate, according to a difference between a predicted value for an amount of electric power to be consumed by a load and the measured value for an amount of electric power consumed by the load.

According to the present disclosure, a determining method and determining apparatus are provided by which it can be determined whether an appropriate CT setting has been set in a watt-hour meter.

It should be noted that general or specific embodiments may be implemented as a system, a method, an integrated circuit, a computer program, a storage medium, or any selective combination thereof.

Additional benefits and advantages of the disclosed embodiments will become apparent from the specification and drawings. The benefits and/or advantages may be individually obtained by the various embodiments and features of the specification and drawings, which need not all be provided in order to acquire one or more of such benefits and/or advantages.

BRIEF DESCRIPTION OF THE DRAWINGS

FIG. 3 illustrates an example of information about the amount of electric power, the information being stored in a CT setting determining apparatus according to an embodiment;

FIG. 4 illustrates examples of various types of information stored in the CT setting determining apparatus according to the embodiment;

FIG. 5 is a flowchart illustrating an operation to make a determination on a CT setting in the determining system according to the embodiment;

FIG. 6 illustrates examples of various types of information that an input device according to an embodiment has acquired from a user;

FIG. 11 illustrates an example of combinations of CT setting mistakes;

FIG. 12 illustrates a method of calculating a CT setting calculation error ratio from a CT setting mistake pattern;

FIG. 16 illustrates an example of determination results displayed on a display device according to an embodiment.

DETAILED DESCRIPTION

Figure 1:
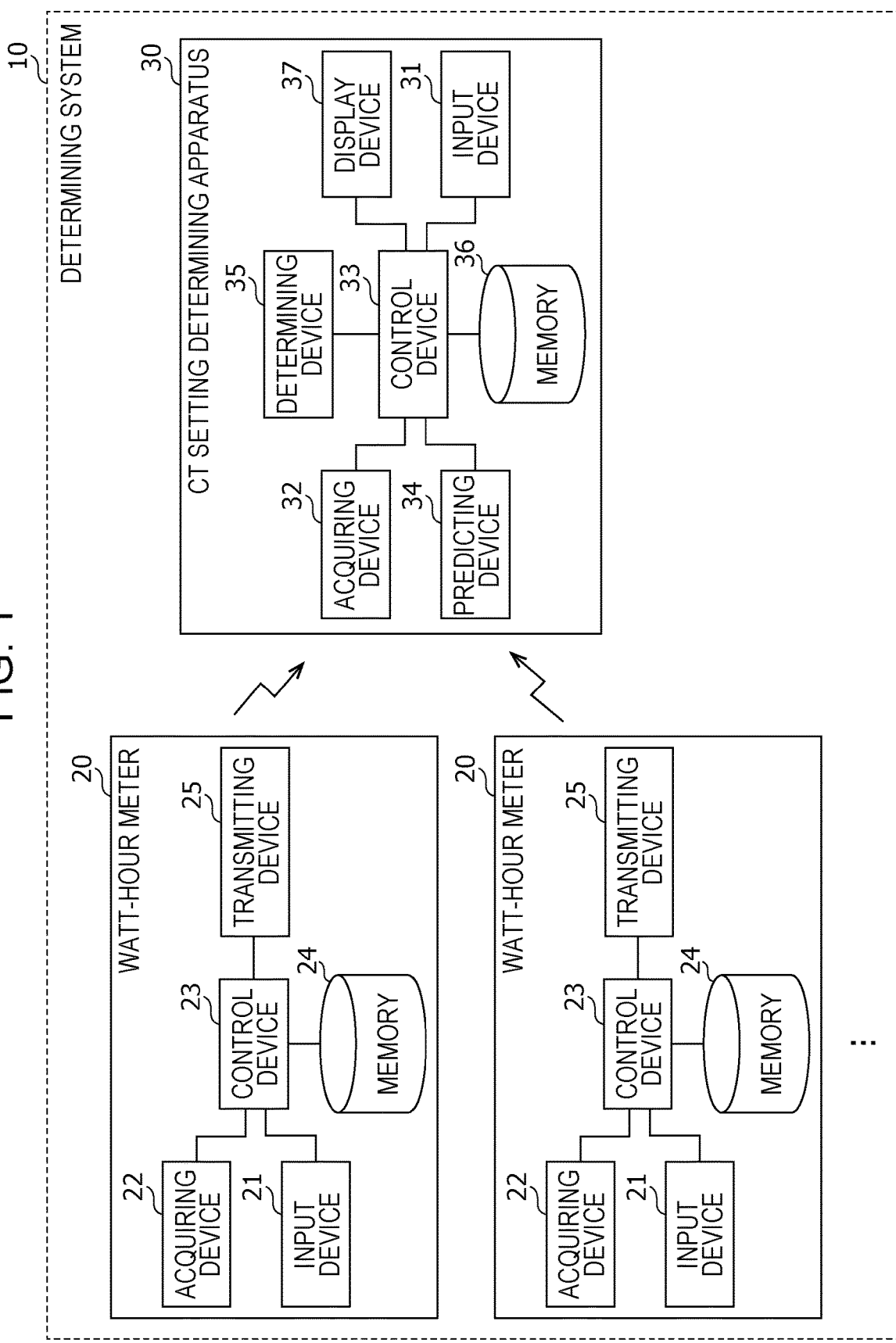
FIG. 1 is a block diagram illustrating the functional structure of a determining system according to an embodiment.

Underlying Knowledge Forming Basis of the Present Disclosure

In a store or the like, a conventional watt-hour meter that uses a current transformer (CT) is installed on an electric power board used for a main line. A worker enters a CT setting into the watt-hour meter according to the current transformation ratio of the installed CT. When there is an input mistake in the CT setting, the watt-hour meter cannot calculate the accurate amount of electric power. The CT setting is a setting set in a watt-hour meter that uses a CT, in accordance with the current transformation ratio of the CT.

As described above, Japanese Unexamined Patent Application Publication No. 2004-138494 discloses a technology to detect an installation mistake by using a voltage and current measured by a watt-hour meter. That is, in the method described in Japanese Unexamined Patent Application Publication No. 2004-138494, a determination is not made as to whether the measured voltage and current are accurate. This is because there is no reference according to which a determination is made as to whether the measured voltage and current are correct. That is, in the conventional method, a mistake in a CT setting cannot be detected.

In view of this, the present disclosure will describe a determining method and determining apparatus by which it can be determined whether a CT setting entered into a watt-hour meter is appropriate.

A determining method according to an aspect of the present disclosure includes: acquiring a measured value for an amount of electric power consumed by the load, the measured value being measured by a watt-hour meter; and determining whether a setting set in a watt-hour meter, the setting according to a current transformation ratio of a current transformer, is appropriate, according to a difference between a predicted value for an amount of electric power to be consumed by a load and the measured value for an amount of electric power consumed by the load.

Thus, it is possible to determine whether the CT setting, which is in accordance with the current transformation ratio of the current transformer, is appropriate from a difference between a measured value for the amount of power consumption that has been actually measured and the predicted value, calculated in a simulation, for the amount of power consumption. When, for example, the CT setting is appropriate, in a case in which it is already found that the measured value and predicted value are close to each other, it can be determined that when the difference is large, the CT setting is inappropriate. That is, just by finding a difference between the measured value and the predicted value, it is possible to determine whether the CT setting entered into the watt-hour meter is appropriate.

When the difference between the predicted value and the measured value is larger than a threshold, the setting may be determined to be inappropriate. When the difference is smaller than the threshold, the setting may be determined to be appropriate.

Thus, since whether the CT setting is appropriate can be determined according to the difference between the predicted value and the measured value, whether the CT setting is appropriate can be determined more precisely.

When the difference between the predicted value and the measured value is within a first range, the setting may be determined to be appropriate. When the difference is within a second range, which indicates that the difference in the second range is larger than in the first range, the setting may be determined to be inappropriate.

Thus, since whether the CT setting is appropriate can be determined according to the difference between the predicted value and the measured value, whether the CT setting is appropriate can be determined more precisely.

The first range may be set in accordance with the load.

Thus, the first range is appropriately set for each type of the load. For example, the first range is set in accordance with the simulation method by which the amount of power consumption is predicted, the simulation method varying depending on the type of the load. That is, when the first range is set in accordance with the load, it can be determined whether the calculation error ratio, which is a difference between the predicted value and the measured value, is within error in the simulation method.

The second range may be set in accordance with the pattern of a setting mistake in the setting.

Thus, since the second range is set in consideration of a difference between the measured value and the predicted value that is taken when a CT setting mistake occurs, it is possible to determine whether the calculation error ratio, which is a difference between a predicted value and a measured value, is a ratio of error generated due to a CT setting mistake. When the second range is set in consideration of a difference caused for each CT setting mistake pattern, even when there are a plurality of CT setting mistake patterns, it is possible to determine whether the calculation error ratio is a ratio of error generated due to a CT setting mistake.

Furthermore, the second range may be set in accordance with the load as well.

Thus, since the second range can be set in consideration of error in the simulation method by which a predicted value is calculated, it can be determined more precisely that the CT setting is inappropriate.

When the setting is determined to be inappropriate, a display indicating that the setting is inappropriate may be given on a display device.

Thus, the user can recognize a watt-hour meter including an inappropriate CT setting just by checking the display device.

When the setting is determined to be inappropriate, an appropriate setting may be displayed on a display device.

Thus, the user can recognize the correct CT setting just by checking the display device.

A determining apparatus according to an aspect of the present disclosure includes: a predicting device that determines a predicated value for the amount of electric power to be consumed by a load; an acquiring device that acquires a measured value for the amount of electric power consumed by the load, the measured value being measured by a watt-hour meter; and a determining device that determines whether a setting set in the watt-hour meter, the setting according to the current transformation ratio of a current transformer, is appropriate, according to a difference between the predicted value and the measured value.

Thus, the same effect as in the determining method described above is provided.

A determining method and determining apparatus, according an aspect of the present disclosure, by which it is determined whether a CT setting is appropriate will be described with reference to the drawings.

Embodiments described below are just specific examples of the present disclosure. Numerals, shapes, constituent elements, the disposition and connection forms of these constituent elements, steps, the sequence of these steps, and the like indicated in the embodiments below are just examples, and are not intended to restrict the present disclosure. Of the constituent elements in the embodiments below, constituent elements not described in independent claims, each of which indicates the topmost concept of the present disclosure, will be described as arbitrary constituent elements. Each drawing is not necessarily drawn in a rigorous manner.

Embodiments

1. Structure of a Determining System

First, a determining system 10 that determines whether a CT setting entered into a watt-hour meter 20 is appropriate will be described with reference to FIG. 1. The watt-hour meter 20 that employs a CT is used to measure the amount of electric power consumed by electric devices installed in, for example, a convenience store, a supermarket, or another store.

FIG. 1 is a block diagram illustrating the functional structure of the determining system 10 according to this embodiment.

As illustrated in FIG. 1, the determining system 10 includes a plurality of watt-hour meters 20 and a CT setting determining apparatus 30. There is no particular limitation on the number of watt-hour meters 20 included in the determining system 10; the determining system 10 may have only one watt-hour meter 20 or may have three or more watt-hour meters 20.

1-1. Watt-Hour Meter

The watt-hour meter 20 is an instrument that measures the amount of electric power consumed in a connected electric circuit. Specifically, the watt-hour meter 20 measures the amount of electric power consumed by a load connected to an electric circuit in which the watt-hour meter 20 is installed.

As illustrated in FIG. 1, the watt-hour meter 20 includes an input device 21, an acquiring device 22, a control device 23, a memory 24, and a transmitting device 25.

The input device 21 is a user interface that accepts a manipulation by the user. Specifically, the input device 21 accepts, from the user, an input that includes a CT setting, and like related to measurement of the amount electric power by the watt-hour meter 20. The input device 21 is composed of, for example, a plurality of physical switches such as pushbuttons, a dial, a slider, and other special devices. Alternatively, the input device 21 may be composed of a display, a touch panel, and software that causes general-purpose buttons or a general-purpose dial to be displayed on the display.

The acquiring device 22 detects a voltage and a current in an electric circuit to which the watt-hour meter 20 is connected. The acquiring device 22 is electrically connected to the electric circuit. The acquiring device 22 is composed of a voltage acquiring device that acquires a voltage and a current acquiring device that acquires a current through a current transformer.

The control device 23 is a type of control apparatus that controls various constituent elements. For example, the control device 23 calculates the amount of consumed electric power from a voltage and current detected by the acquiring device 22 and a CT setting stored in the memory 24. When, for example, the CT setting is 2000:1, the control device 23 multiplies the amount of electric power, which is the product of the voltage and current acquired by the acquiring device 22, by 2000 to calculate the amount of electric power that has been actually consumed by the load. The calculated amount of electric power is transmitted to, for example, the CT setting determining apparatus 30. For example, information related to the amount of electric power, which includes the date and time at which the amount of electric power and the calculated amount of electric power was measured and the calculated amount of electric power, is transmitted to the CT setting determining apparatus 30. Information related to the amount of electric power may include information that identifies the watt-hour meter used. The control device 23 may store information acquired through the input device 21 and the calculated amount of electric power in the memory 24. In the description below, the calculated amount of electric power will also be referred to as the measured value.

The control device 23 may transmit the amount of electric power measured to the CT setting determining apparatus 30 one after another or at intervals of a predetermined period. The predetermined period is, for example, one hour or one day.

The control device 23 is implemented by, for example, a microprocessor that includes a non-volatile memory that stores programs, a volatile memory such as a random-access memory (RAM), a processor that executes the programs, an input/output circuit that interconnects a peripheral circuit and the processor, and the like. The control device 23 may be an independent control device that performs centralized control. Alternatively, the control device 23 may be composed of a plurality of control devices that mutually cooperate to perform distributed control. Alternatively, the control device 23 may be implemented by a special circuit or a combination of a microcomputer and a special circuit.

The memory 24 is a storage device that stores information entered into the input device 21 by the user, the amount of electric power calculated by the control device 23, and other information. The memory 24 is implemented by a semiconductor memory or the like.

The transmitting device 25 is a communication circuit that transmits, to the CT setting determining apparatus 30, information including the amount of electric power calculated by the control device 23. The transmitting device 25 communicates with the CT setting determining apparatus 30 and other devices disposed outside the store through the Internet or another wide-area network.

When an electric power amount collection apparatus (not illustrated) that collects calculated amounts of electric power from watt-hour meters 20 is installed in the store, the electric power amount collection apparatus may transmit information including the amounts of electric power to the CT setting determining apparatus 30 through the Internet or the like.

Connections in the watt-hour meter 20 will be described below with reference to FIG. 2.

Figure 2:
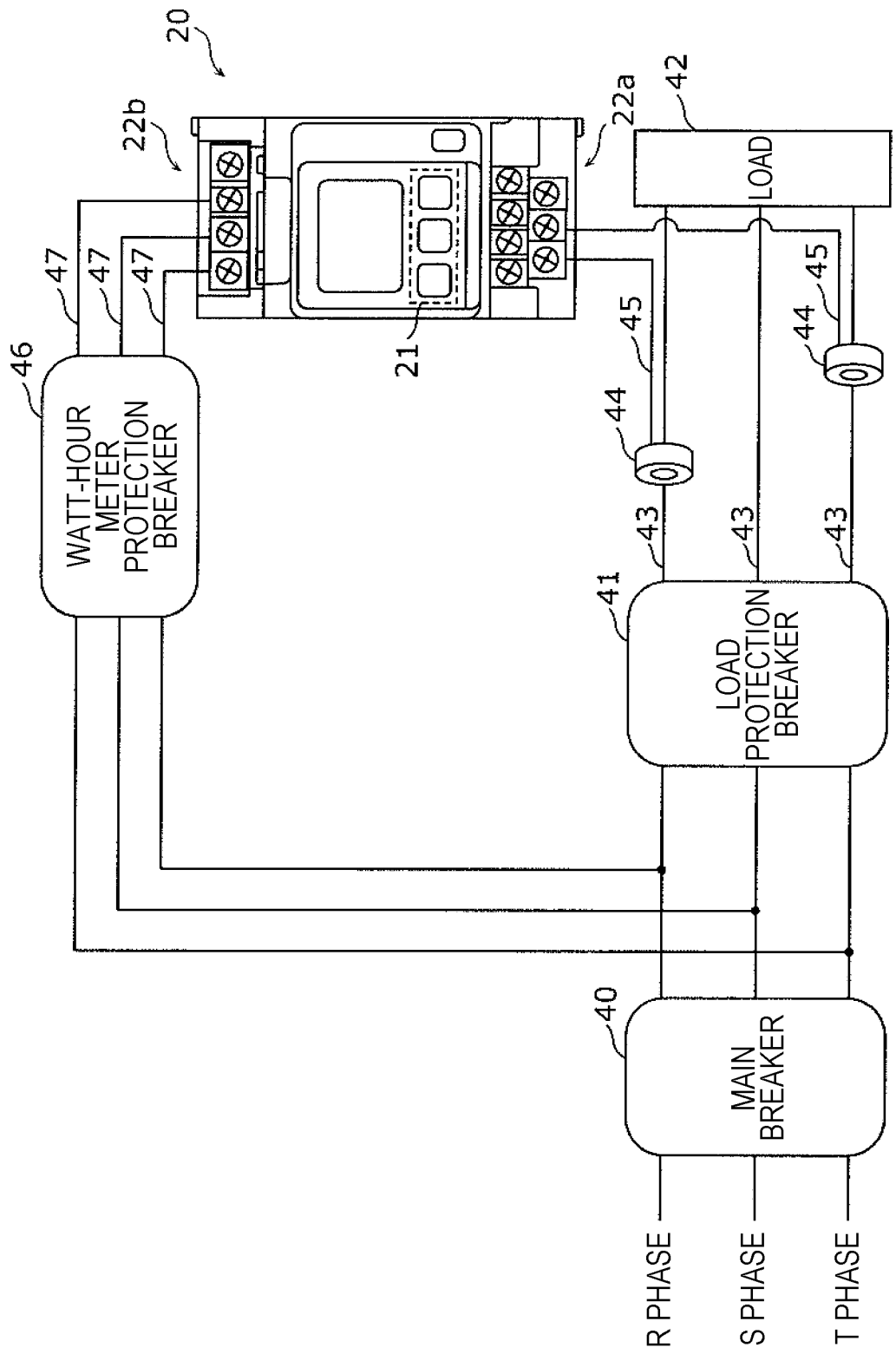
FIG. 2 schematically illustrates connections in a watt-hour meter according to an embodiment.

FIG. 2 schematically illustrates connections in the watt-hour meter 20 according to this embodiment.

A case will be described in which three-phase alternate power is supplied from an external power source to a load as illustrated in FIG. 2. A main breaker 40 is a type of breaker that turns on and off power supply from the external power source. The main breaker 40 stops the supply of electric power from the external power source when a current exceeding a predetermined current comes from the external power supply. A load protection breaker 41 is a type of breaker that stops the supply of electric power to a power line 43 that electrically interconnects the load protection breaker 41 and a load 42 when an overcurrent flows into a power line 43. That is, the load protection breaker 41 protects the load 42 from an overcurrent. The external power source is, for example, a commercially available power source.

A current transformer 44 is placed on a power line 43. Specifically, two current transformers 44 are placed on two of the three power line 43, one for each power line 43. Each current transformer 44 is electrically connected to a current acquiring device 22a in the watt-hour meter 20 through a power line 45. Thus, a current directed to the power line 43 is transformed according to the current transformation ratio of the current transformer 44, after which the transformed current flows into the current acquiring device 22a. The two current transformers 44 have the same current transformation ratio.

A watt-hour meter protection breaker 46 is a type of breaker that stops the supply of electric power to a power line 47 that electrically interconnects the watt-hour meter protection breaker 46 and watt-hour meter 20 when an overcurrent flows into the power line 47. That is, the watt-hour meter protection breaker 46 protects the watt-hour meter 20 from an overcurrent.

Power lines 47 are electrically connected to a voltage acquiring device 22b in the watt-hour meter 20. Thus, a voltage applied to the load 42 is entered into the voltage acquiring device 22b.

When installing the watt-hour meter 20, the user enters a setting according to the current transformation ratio of the disposed current transformer 44 through the input device 21.

A load is, for example, an electric device in the store. Examples of electric devices include cooling devices, air conditioners, and lighting fixtures. In the description below, a cooling device, an air conditioner, and a lighting fixture will also be referred to as a cooling type, an air-conditioning type, and a lighting type, respectively.

1-2. CT Setting Determining Apparatus

The CT setting determining apparatus 30 is a type of processing apparatus that determines whether a CT setting set in the watt-hour meter 20 is appropriate, from a measured value for the amount of electric power, the measured value being measured by the watt-hour meter 20, and a predicted value for the amount of electric power, the predicted value being calculated in a simulation. The CT setting determining apparatus 30 may be implemented by, for example, a personal computer or a server apparatus. The CT setting determining apparatus 30 may be installed in a store or at a place other than in a store. When, for example, a plurality of stores are concerned, the CT setting determining apparatus 30 may be installed in, for example, an office that manage the plurality of stores.

As illustrated in FIG. 1, the CT setting determining apparatus 30 includes an input device 31, an acquiring device 32, a control device 33, a predicting device 34, a determining device 35, a memory 36, and a display device 37.

The input device 31 is a user interface that accepts a manipulation by the user. Specifically, the input device 31 accepts, from the user, information related to the watt-hour meter 20 and a load and a command to determine whether a CT setting set in the watt-hour meter 20 is appropriate. The input device 31 composed of, for example, a keyboard and a mouse.

The acquiring device 32 is a type of apparatus that acquires a measured value for the amount of electric power consumed by a load and measured by the watt-hour meter 20. The acquiring device 32 is, for example, a communication circuit that wirelessly receives, from the transmitting device 25 in the watt-hour meter 20, information including the amount of electric power consumed by the load. There is no particular limitation on the method of wirelessly communicating with the transmitting device 25. The acquiring device 32 communicates through, for example, the Internet or another wide-area network.

The information acquired through the acquiring device 32 is stored in the memory 36 under control of the control device 33. When a plurality of stores are concerned, the CT setting determining apparatus 30 acquires information related to the amount of electric power and other information from each of the plurality of stores through the acquiring device 32. In this case, the control device 33 may store acquired information related to the amount of electric power and information related to the stores in the memory 36 in accordance with each other.

The control device 33 is a type of control apparatus that controls various constituent elements. For example, when the control device 33 receives a command to determine whether a CT setting set in the watt-hour meter 20 is appropriate from the user through the input device 31, the control device 33 causes the predicting device 34 to calculate a predicted value for the amount of electric power. The control device 33 then causes the determining device 35 to determine whether the CT setting set in the watt-hour meter 20 is appropriate, from the measured value for the amount of electric power, the measured value being acquired from the watt-hour meter 20, and the predicted value for the amount of electric power, the predicted value being calculated by the predicting device 34. The control device 33 causes the display device 37 to display the result of the determination made by the determining device 35.

The predicting device 34 is a type of processing apparatus that determines a predicted value for the amount of electric power to be consumed by a load, from a period over which the amount of power consumption is predicted and the type of a load, the period and type being acquired through the input device 31, and from a simulation method of predicting the amount of electric power to be consumed by the load. A simulation method, which is set for each load, is stored in, for example, the memory 36 in advance. The predicting device 34 calculates a predicted value for the amount of power consumption in the period over which prediction is performed, from the type of the load, the type being acquired through the acquiring device 32, and the simulation method of simulating the amount of electric power to be consumed by the load. The simulation method executed by the predicting device 34 to calculate a predicted value will be described later in detail. The type of the load indicates the type of an electric device in the store. The type indicates, for example, the cooling type, air-conditioning type, or lighting type.

The determining device 35 is a type of processing apparatus that determines whether a CT setting set in the watt-hour meter 20 is appropriate, from a measured value for the amount of electric power consumed by a load, the measured value having been acquired by the acquiring device 32, and a predicted value determined by the predicting device 34 for the amount of electric power to be consumed by the load. The method by which the determining device 35 makes a determination will be described later in detail.

The memory 36 is a type of memory device that stores information entered through the input device 31, information acquired by the acquiring device 32, a predicted value determined by the predicting device 34 for the amount of electric power to be consumed for a load, the result of a determination made by the determining device 35, and the like. The memory 36 is implemented by a hard disk drive (HDD), a semiconductor memory, or the like.

The display device 37 is a type of a display apparatus that displays, under control of the control device 33, the result of a determination made by the determining device 35. The display device 37 is implemented by, for example, a display such as a liquid crystal display.

The control device 33, predicting device 34, and determining device 35 each have, for example, a memory in which programs are stored and a processor that executes the programs. The memory may be a non-volatile memory or a volatile memory such as a RAM. The control device 33, predicting device 34, and determining device 35 each may further have an input/output circuit that interconnects a peripheral circuit and the processor and other circuits, and may be implemented by a microprocessor or the like. The control device 33, predicting device 34, and determining device 35 may be implemented by a single microcomputer that has their functions or may be implemented by individual microcomputers. Alternatively, they may be implemented by a special circuit or a combination of a microcomputer and a special circuit.

The CT setting determining apparatus 30 is an example of a determining apparatus that determines whether a CT setting in the watt-hour meter 20 is appropriate.

Information stored in the memory 36 will be descried with reference to FIGS. 3 and 4.

FIG. 3 illustrates an example of information about the amount of electric power, the information being stored in the CT setting determining apparatus 30 according to this embodiment. In other words, the information illustrated in FIG. 3 is information acquired from the watt-hour meter 20 through the acquiring device 32. FIG. 4 illustrates examples of various types of information stored in the CT setting determining apparatus 30 according to this embodiment. In other words, the information illustrated in FIG. 4 is information acquired through the input device 31.

As illustrated in FIG. 3, the CT setting determining apparatus 30 stores information related to the amount of electric power measured by the watt-hour meter 20. Specifically, the control device 33 receives information related to the amount of electric power from the watt-hour meter 20 and stores the received information in the memory 36. The information related to the amount of electric power includes information that identifies a watt-hour meter 20, information indicating a date and time of measurement, and information related to the amount of electric power measured.

In FIG. 3, as an example, unique numbers preset for individual watt-hour meters 20 as in "watt-hour meter 1" and "watt-hour meter 2" are stored as information that identifies watt-hour meters 20. Information that identifies a watt-hour meter 20 may be any information that can identify an individual watt-hour meter 20; the information may be, for example, the manufacturing number of the watt-hour meter 20 or another number that is uniquely assigned to the watt-hour meter 20. When a plurality of stores are concerned, information related to a store may be included in information related to the amount of electric power.

In FIG. 3, a date and time at which measurement of the amount of electric power was started is indicated as an example of information related to a date and time of measurement. Another example is also illustrated in which the total amount of electric power consumed in one hour starting from the date and time of measurement is stored as information related to the amount of electric power. However, information related to the amount of electric power may not have been stored at intervals of one hour; the information may be the total amount of electric power in a period preset by the user such as, for example, one day.

As illustrated in FIG. 4, the CT setting determining apparatus 30 stores various types of information acquired through the input device 31. Specifically, the memory 36 stores a table in which the types of watt-hour meters 20 and CT settings settable in these watt-hour meters 20 in accordance with each other, as illustrated in FIG. 4(a). The type of each watt-hour meter 20 is information by which a CT setting settable in the watt-hour meter 20 can be identified. Examples of the type of the watt-hour meter 20 include its model and product name. The example in FIG. 4(a) indicates that two models, model A and model B, as the types of watt-hour meters 20 and that two CT settings, CT1 and CT2, can be set in the model-A watt-hour meter 20 and three CT settings, CT3, CT4 and CT5, can be set in the model-B watt-hour meter 20. As an example: for CT1, a current transformation ratio of 2000:1 is set; for CT2, a current transformation ratio of 3000:1 is set; for CT3, a current transformation ratio of 1000:1 is set; for CT4, a current transformation ratio of 2000:1 is set; and for CT5, a current transformation ratio of 4000:1 is set.

As illustrated in FIG. 4(b), the memory 36 stores a table in which information by which each watt-hour meter 20 is identified and the types of loads for each of which the relevant watt-hour meter 20 measured the amount of electric power, in accordance with each other. In the example in FIG. 4(b), three watt-hour meters 20 measured the amount of electric power for a freezing machine as the cooling type. As types of loads, an air-conditioning type of device, a lighting type of device, and other electric devices used in stores can be set besides the cooling type of device.

As illustrated in FIG. 4(c), the memory 36 stores a table in which types of loads, information related to simulation methods used by the predicting device 34 to predict the amount of electric power, and error ratios in the prediction of the amount of electric power by these simulation methods, in accordance with one another. Since a different method is used to simulate the amount of electric power for a different type of load, a simulation method is set for each type of load. In addition, the ratio of error included in the predicted amount of electric power varies depending on the simulation method. For each simulation method, therefore, a standard calculation error ratio is set according to the simulation method. The standard calculation error ratio indicates the ratio of error in the amount of electric power calculated in a simulation to the amount of electric power measured by the watt-hour meter 20. When the type of a load is the cooling type, the standard calculation error ratio is ±10%. For example, a predicated value calculated in a simulation may cause a deviation of ±10% with respect to the value measured by the watt-hour meter 20. The standard calculation error ratio will be described later in detail.

Although, in FIG. 4(c), one simulation method and one standard calculation error ratio are associated with each type of load, a plurality of simulation methods may be associated with each type of load and a standard calculation error ratio may be associated for each simulation method.

Now, a freezing machine simulation will be described; the freezing machine simulation is a simulation method for the amount of electric power in a freezing machine, which is an example of the cooling type. The freezing machine simulation is, for example, a simulation method of calculating a predicted value from the rated coefficient of performance (COP) of a freezing machine, the rated thermal load of a showcase frozen or cooled by the freezing machine, and a diagnosis period. Specifically, the rated COP of the freezing machine is determined from the product name and catalog of the freezing machine. When catalog information about the freezing machine is stored in the memory 36, the COP of the freezing machine may be determined from the catalog information stored in the memory 36. The rated thermal load of the showcase is determined from the product name and catalog of the showcase. The power consumption of the freezing machine is calculated by dividing the rated thermal load of the showcase by the rated COP. When, for example, the rated COP is 2 and the rated thermal load of the showcase is 10 kW, power consumption of the freezing machine is 5 kW. The amount of electric power consumed in the diagnosis period is calculated by multiplying the power consumption of the freezing machine by the diagnosis period. When the diagnosis period is one hour, the amount of electric power consumed in the diagnosis period is 5 kWh. When a predicted value for the amount of power consumption calculated as described above is corrected for an effect such as a change in COP caused by the ambient temperature, the predicted value empirically includes about ±10% of error.

The simulation method described above is not a limitation. The value of the standard calculation error ratio is determined according to the simulation method. When the simulation method is changed, therefore, a standard calculation error ratio is set according to the new simulation method. In addition, there is no particular limitation on simulation methods for the amount of electric power in the air-conditioning type and lighting type. It is only necessary to mutually associate a simulation method for the amount of electric power and a standard calculation error ratio matching the simulation method.

As illustrated in FIG. 4(d), the memory 36 stores a table in which information that identifies watt-hour meters 20 and calculation error ratios, each of which is calculated from a calculated value and predicted value for the amount of electric power, in accordance with each other. For example, the control device 33 stores a calculation error ratio calculated by the predicting device 34 in the memory 36. The calculation error ratio will be described later in detail.

As illustrated in FIG. 4(e), the memory 36 stores a table in which the types of watt-hour meters 20 and CT setting calculation error ratios, each of which indicates a ratio of error in the amount of power consumption, the error being generated when an incorrect CT setting is entered. The CT setting calculation error ratio will be described later in detail.

2. Determination as to Whether a CT Setting is Appropriate

Next, a flow of a determination as to whether a CT setting is appropriate will be described with reference to FIGS. 5 to 16.

FIG. 5 is a flowchart illustrating an operation to make a determination on a CT setting in the determining system 10 according to this embodiment.

First, the CT setting determining apparatus 30 acquires various types of information entered by the user through the input device 31 (S10). The various types of information includes the types of the watt-hour meter 20 and current transformer 44 that have been placed, the type of a connected load, and a diagnosis period over which the amount of power consumption is calculated.

Here, an example of information that user enters in step S10 will be described with reference to FIG. 6.

FIG. 6 illustrates examples of various types of information that the input device 31 has acquired from the user according to this embodiment. Information entered by the user includes information about the watt-hour meter 20, information about the installed current transformers 44, information about a load, and a diagnosis period. Information about the watt-hour meter 20 includes the type of each placed watt-hour meter 20 and the number of placed watt-hour meters 20. FIG. 6 indicates that 12 watt-hour meters 20 the type of which is model A have been placed. Information about the installed current transformer 44 includes information about the current transformation ratio of the current transformer 44 that has been installed for each watt-hour meter 20. The model of the watt-hour meter 20 is A, so the type of the CT is CT1 or CT2 as illustrated in FIG. 4(a). A load for which the relevant watt-hour meter 20 measures the amount of electric power is the cooling type for all watt-hour meters 1 to 12. Specifically, the load is a freezing machine. The diagnosis period is one month of January 2017.

After the information indicated in FIG. 6 has been entered, the CT setting determining apparatus 30 determines whether CT setting of each indicated watt-hour meter 20 is appropriate. In a case in which 12 watt-hour meters 20 are indicated, the CT setting determining apparatus 30 determines whether CT setting of each of the 12 watt-hour meters 20 is appropriate. Therefore, the CT setting determining apparatus 30 first calculates various error ratios.

The information indicated in FIG. 6 is stored in the memory 36 provided in the CT setting determining apparatus 30.

Assuming that 12 watt-hour meters 20, each of which uses the current transformer 44, have been placed, how a determination is made will be described below as to whether the CT setting set for each watt-hour meter 20 is appropriate.

2-1. Calculation of a Calculation Error Ratio

Referring again to FIG. 5, after an input has been acquired from the user in step S10, a calculation error ratio is first calculated (S20). Calculation of a calculation error ratio will be described with reference to FIG. 7.

Figure 7:
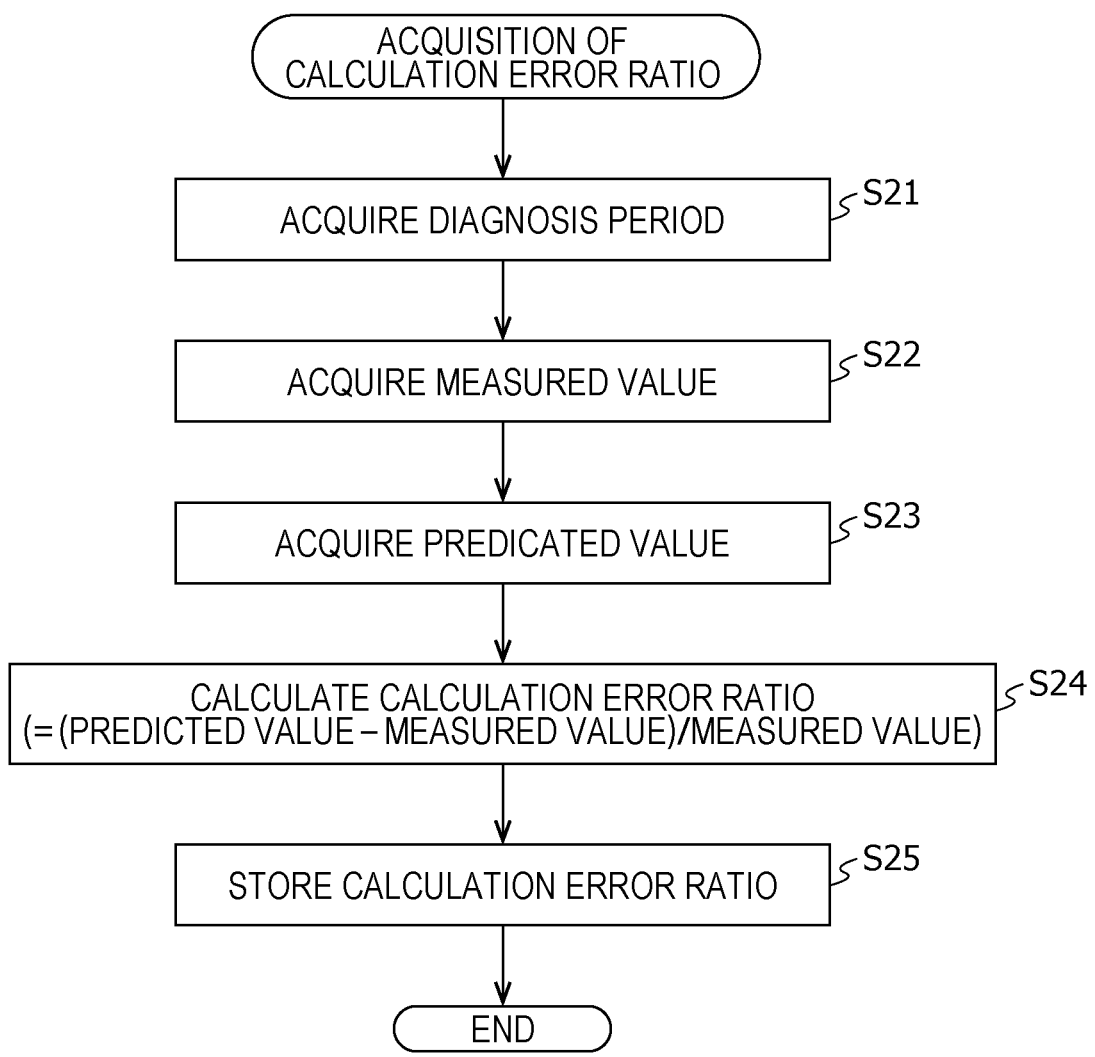
FIG. 7 is a flowchart illustrating an operation to acquire a calculation error ratio according to an embodiment.

FIG. 7 is a flowchart illustrating an operation to acquire a calculation error ratio according to this embodiment.

As illustrated in FIG. 7, the control device 33 first acquires a diagnosis period from the information entered by the user in step S10 (S21) to calculate a calculation error ratio. For example, from input information entered by the user and stored in the memory 36, the control device 33 acquires information indicating that the diagnosis period is one month of January 2017.

Next, the control device 33 reads out, from the memory 36, the amount of electric power consumed by the 12 watt-hour meters 20 in the diagnosis period. That is, the control device 33 reads out a measured value for the amount of power consumption (S22). When information stored in the memory 36 about the amount of power consumption is data measured at intervals of one hour as illustrated in FIG. 3, the control device 33 reads out, from the memory 36, information about the amounts of power consumption for one-month diagnosis period and sums the read-out amounts of power consumptions to calculate the total of the amounts of power consumption in the diagnosis period.

Next, the control device 33 acquires a predicated value for the amounts of power consumption in the diagnosis period (S23). In this embodiment, one simulation method is associated for each type of load, as illustrated in FIG. 4(c). Therefore, a simulation for the amount of power consumption is executed according to the type of load entered in step S10. When the type of load is the cooling type, the predicting device 34 calculates a predicted value by the simulation method, described above, of predicting the amount of electric power to be consumed by the cooling type. As the predicted value, the total amount of electric power in the diagnosis period entered in step S10 is calculated. Since, in this embodiment, the diagnosis period is one month of January 2017, the total amount of electric power in one month of January 2017 is calculated by the simulation.

Figure 8:
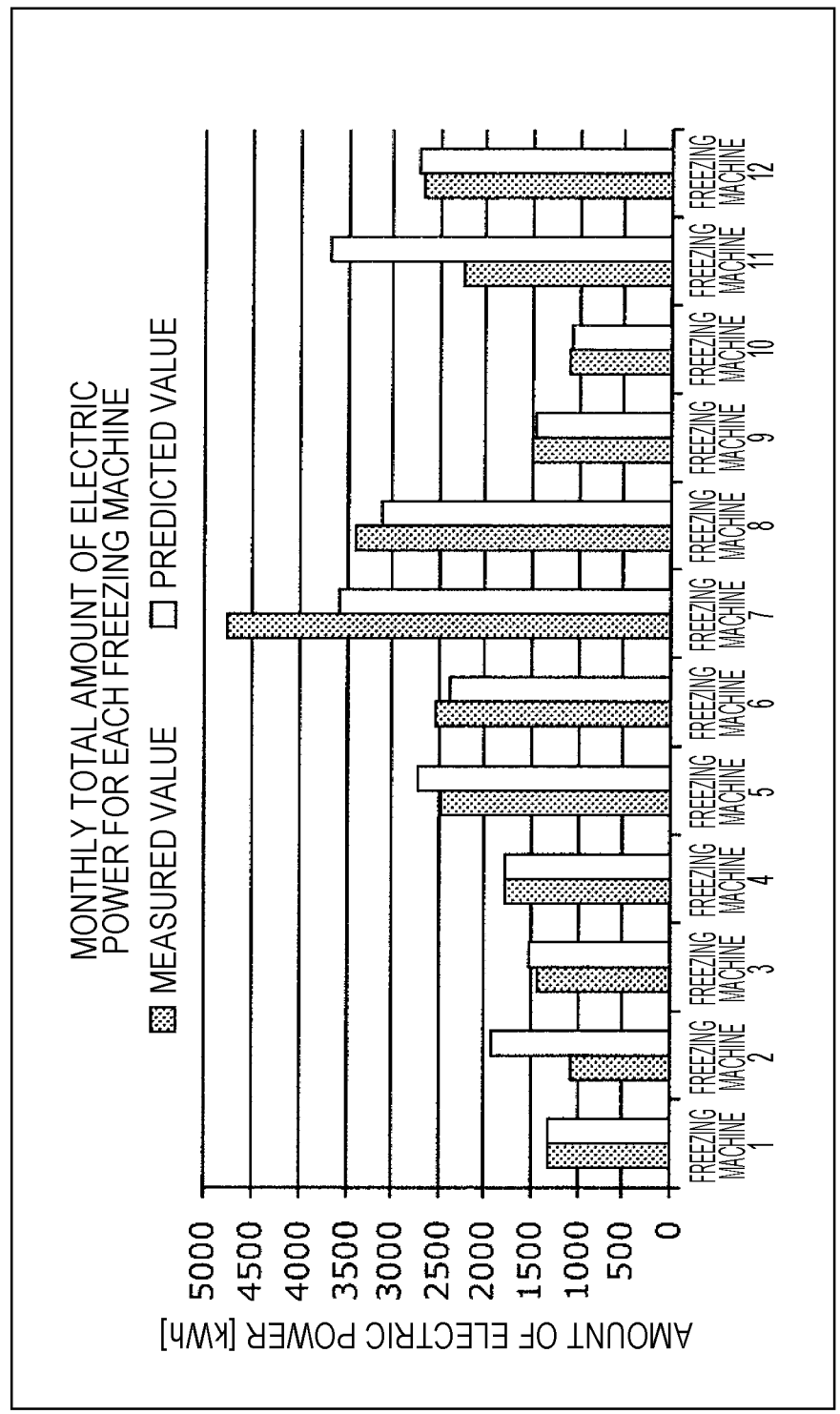
FIG. 8 is a graph comparing calculated values and predicted values according to an embodiment.

For example, the control device 33 may display, on the display device 37, a graph that compares predicted values with measured values as illustrated in FIG. 8. Thus, the user can confirm the measured values for the amount of electric power and the predicted values for the amount of electric power as well as differences in the amount of electric power between the measured values and the predicted values. In FIG. 8, the amount of electric power is indicated for each freezing machine, which is a type of load. Watt-hour meter 1 indicates the measured amount of electric power for freezing machine 1, and watt-hour meter 2 indicates the measured amount of electric power for freezing machine 2. This is also true for the remaining watt-hour meters.

Next, the predicting device 34 calculates a calculation error ratio, which is a ratio of error in a predicated value to a calculated value (S24). To calculate a calculation error ratio, the predicting device 34 subtracts a measured value from a predicated value and divides the subtracted value by the measured value. The control device 33 stores the calculation error ratio calculated by the predicting device 34 in the memory 36 (S25).

As described above, a calculation error ratio is calculated from a predicted value and calculated value for the amount of electric power. The calculation error ratio calculated by the predicting device 34 is an example of a difference between the predicted amount of electric power to be consumed by the load and the measured value for the amount of electric power consumed by the load and measured by the watt-hour meter 20.

2-2. Calculation of a Standard Calculation Error Ratio

Referring again to FIG. 5, after a calculation error ratio is calculated in step S20, a standard calculation error ratio is acquired (S30). Acquisition of a standard calculation error ratio will be described with reference to FIG. 9. The standard calculation error ratio is a ratio of error in a simulation method used to calculate a predicted amount of electric power in step S23. That is, the standard calculation error ratio is an error ratio assumed when there is no CT setting mistake.

In the simulation methods described above, for example, the amount of power consumption is calculated from the rated thermal load of the showcase. That is, the amount of power consumption when the thermal load is always constant is calculated. In an actual environment, however, the thermal load may change with time. Therefore, error may occur between a measured value and a predicted value according to the simulation method. Error is a difference between a predicted value and a measured value indicating a true value. Now, a method of acquiring an error ratio according to the simulation method will be described.

Figure 9:
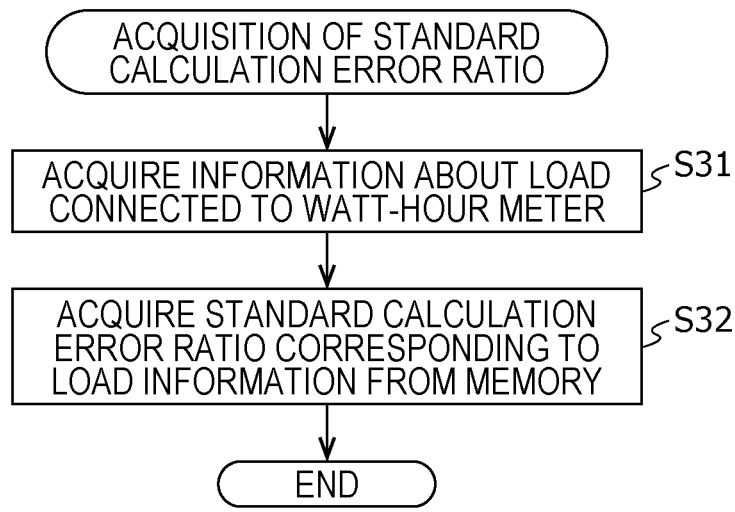
FIG. 9 is a flowchart illustrating an operation to acquire a standard calculation error ratio according to an embodiment.

FIG. 9 is a flowchart illustrating an operation to acquire a standard calculation error ratio according to this embodiment.

As illustrated in FIG. 9, the control device 33 acquires information about the load connected to the watt-hour meter 20 from the information entered in step S10 (S31). Specifically, the control device 33 acquires the type of the load connected to the watt-hour meter 20. In this embodiment, all the 12 watt-hour meters 20 are connected so as to measure the amount of electric power consumed by the cooling type, as illustrated in FIG. 6. Therefore, the control device 33 acquires information indicating that the type of the load is the cooling type in step S31.

The control device 33 then acquires, from the memory 36, the standard calculation error ratio according to the type of the load. For example, the memory 36 stores a table in which types of loads and standard calculation error ratios in accordance with each other as illustrated in FIG. 4(c). The control device 33 reads out the standard calculation error ratio according to the type of the load from the memory 36. That is, the control device 33 acquires the standard calculation error ratio according to the type of the load (S32).

So far, only one simulation method has been set to predict the amount of power consumption for each load type. However, a plurality of simulation methods may be set for each load type. In this case, after the control device 33 has acquired a command concerning a simulation method from the user through the input device 31 in step S10, the control device 33 may read out, from the memory 36, the standard calculation error ratio according to the acquired simulation method.

2-3. Calculation of a CT Setting Calculation Error Ratio

Referring again to FIG. 5, after a standard calculation error ratio has been acquired in step S30, a CT setting calculation error ratio is acquired (S40). Acquisition of a CT setting calculation error ratio will be described with reference to FIG. 10. The CT setting calculation error ratio is a value indicating the degree of error caused in a measured value when a CT setting to be set in the watt-hour meter 20 is incorrectly entered. Specifically, the CT setting calculation error ratio indicates a ratio of a value to a measured value derived according to an incorrectly entered CT setting, the value being added to or subtracted from the measured value to calculate the correct amount of electric power. That is, the CT setting calculation error ratio is an error ratio assumed when there is a CT setting mistake.

Figure 10:
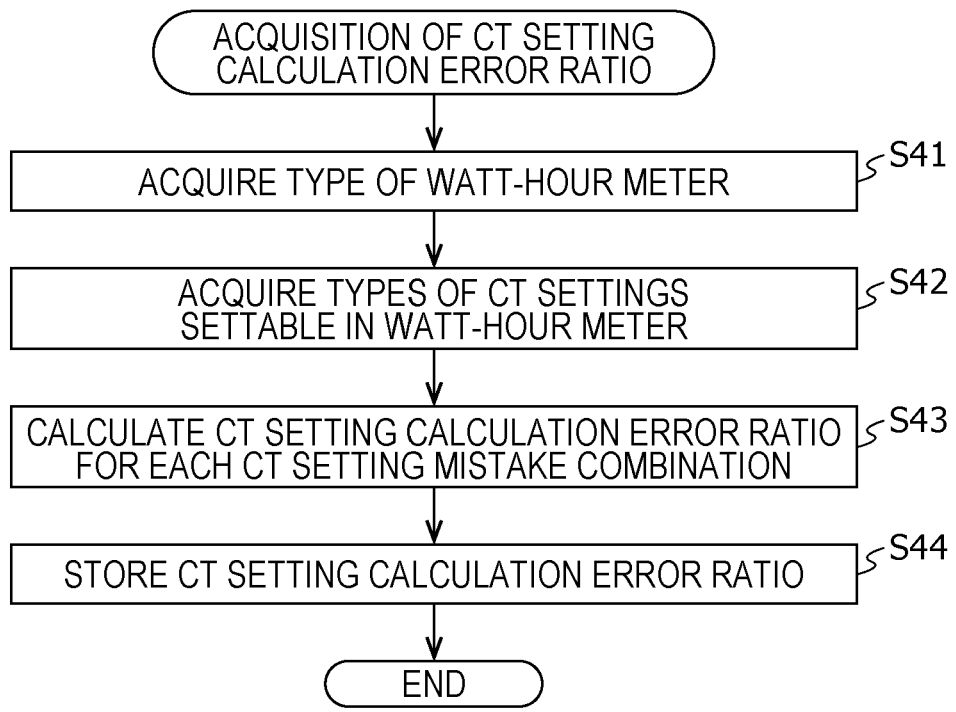
FIG. 10 is a flowchart illustrating an operation to acquire a CT setting calculation error ratio.

FIG. 10 is a flowchart illustrating an operation to acquire a CT setting calculation error ratio.

As illustrated in FIG. 10, the control device 33 acquires the type of the watt-hour meter 20, the type having been entered in step S10 (S41). In this embodiment, all the 12 watt-hour meters 20 are the model A as illustrated in FIG. 6. Therefore, in step S41, the control device 33 acquires information indicating that the type of the watt-hour meter 20 is the model A.

The control device 33 then acquires the types of the CT settings according to the type, obtained in step S41, of the watt-hour meter 20 from the table, stored in the memory 36 as illustrated in FIG. 4(a), in which the types of watt-hour meters 20 and settable CT types are mutually associated (S42). Since, in this embodiment, all the 12 watt-hour meters 20 are the model A, the control device 33 reads out two CT settings, CT1 and CT2, from the memory 36. That is, the model-A watt-hour meter 20 is a watt-hour meter for which two choices, CT1 and CT2, are available as CT settings.

The control device 33 calculates a CT setting calculation error ratio for each of CT setting mistake combinations derived from the acquired CT settings (S43). Calculation of a CT setting calculation error ratio will be described with reference to FIGS. 11 and 12 for a case in which the current transformation ratio of the CT1 is 2000:1 and the current transformation ratio of the CT2 is 3000:1 as illustrated in FIG. 4(a).

FIG. 11 illustrates an example of combinations of CT setting mistakes.

In the example in FIG. 11, combinations are illustrated for a case in which the type of watt-hour meters 20 is the mode A and a case in which the type of watt-hour meters 20 is model B. When the mode of a watt-hour meter 20 is A, two CT settings, CT1 and CT2, are settable in the watt-hour meter 20. In this case, two types of current transformers 44, CT1 and CT2, are eligible for being installed. That is, the current transformation ratio of a current transformer 44 to be installed is either of 2000:1 and 3000:1. CT setting mistakes are combined in two ways: although the current transformation ratio of the installed current transformer 44 is 2000:1, the type of the CT set in the watt-hour meter 20 is 3000:1; and although the current transformation ratio of the installed current transformer 44 is 3000:1, the type of the CT set in the watt-hour meter 20 is 2000:1.

In FIG. 11, other combinations are also indicated for a case in which the model of the watt-hour meter 20 is B. In a model-B watt-hour meter 20, three CT settings, CT3 to CT5, are settable. In this case, CT setting mistakes are combined in six ways.

FIG. 12 illustrates a method of calculating a CT setting calculation error ratio from a CT setting mistake pattern.

When the type of the installed CT is CT1 (its current transformation ratio is 2000:1) and the type, set in the watt-hour meter 20, of the CT is CT2 (its current transformation ratio is 3000:1) as illustrated in FIG. 12, the watt-hour meter 20 derives a measured value by multiplying the measured amount of electric power by 3000 to make a correction for the CT, instead of performing a multiplication by 2000 that would otherwise be performed when the CT setting is correct. That is, the measured amount of electric power is 1.5 times as much as the amount of electric power when the CT setting is correct. In this case, by eliminating the effect of the correction performed for the measured value by using an incorrectly set CT setting and performing a correction according to the correct CT setting, the correct measured value can be acquired. A specific example will be described below. When a measured value is corrected by using an incorrectly set CT setting as illustrated in FIG. 12, the measured value is divided by 3000, which causes an incorrect correction, after which the resulting value is multiplied by 2000, which causes a correct correction. That is, when the measured value derived by using the incorrectly set CT setting is multiplied by 0.67, the correct amount of electric power can be calculated. In other words, the correct amount of electric power is derived by subtracting a value equal to 33% of the measured value derived by using the incorrectly set CT setting from the measured value. In this case, the CT setting calculation error ratio is −33%.

When the type of the installed CT is CT2 (its current transformation ratio is 3000:1 and the type, set in the watt-hour meter 20, of the CT is CT1 (its current transformation ratio is 2000:1), a CT setting calculation error ratio is similarly calculated. In this case, the CT setting calculation error ratio is 50%. In other words, the correct amount of electric power is derived by subtracting a value equal to 50% of the measured value derived by using the incorrectly set CT setting from the measured value.

When two current transformation ratios, 2000:1 and 3000:1, are settable in the watt-hour meter 20 as described above, two CT setting calculation error ratios, −33% and 50%, are derived. When three current transformation ratios are settable in the watt-hour meter 20 as illustrated in FIG. 11, six CT setting calculation error ratios, for example, are derived.

After a CT setting calculation error ratio has been calculated in step S43, the control device 33 stores the CT setting calculation error ratio in the memory 36 (S44).

As described above, a CT setting calculation error ratio is calculate for each CT setting mistake.

2-4. Determination as to Whether a CT Setting is Appropriate

Referring again to FIG. 5, after various calculation error ratios have been acquired in steps S20 to S40, the determining device 35 determines whether there is a mistake in the CT setting (S50). A determination as to whether there is a mistake in a CT setting set in the watt-hour meters 20 will be described below with reference to FIG. 13. Specifically, a determination will be described as to whether there is a difference between the current transformation ratio of the installed current transformer 44 and the CT setting set in the watt-hour meter 20.

Figure 13:
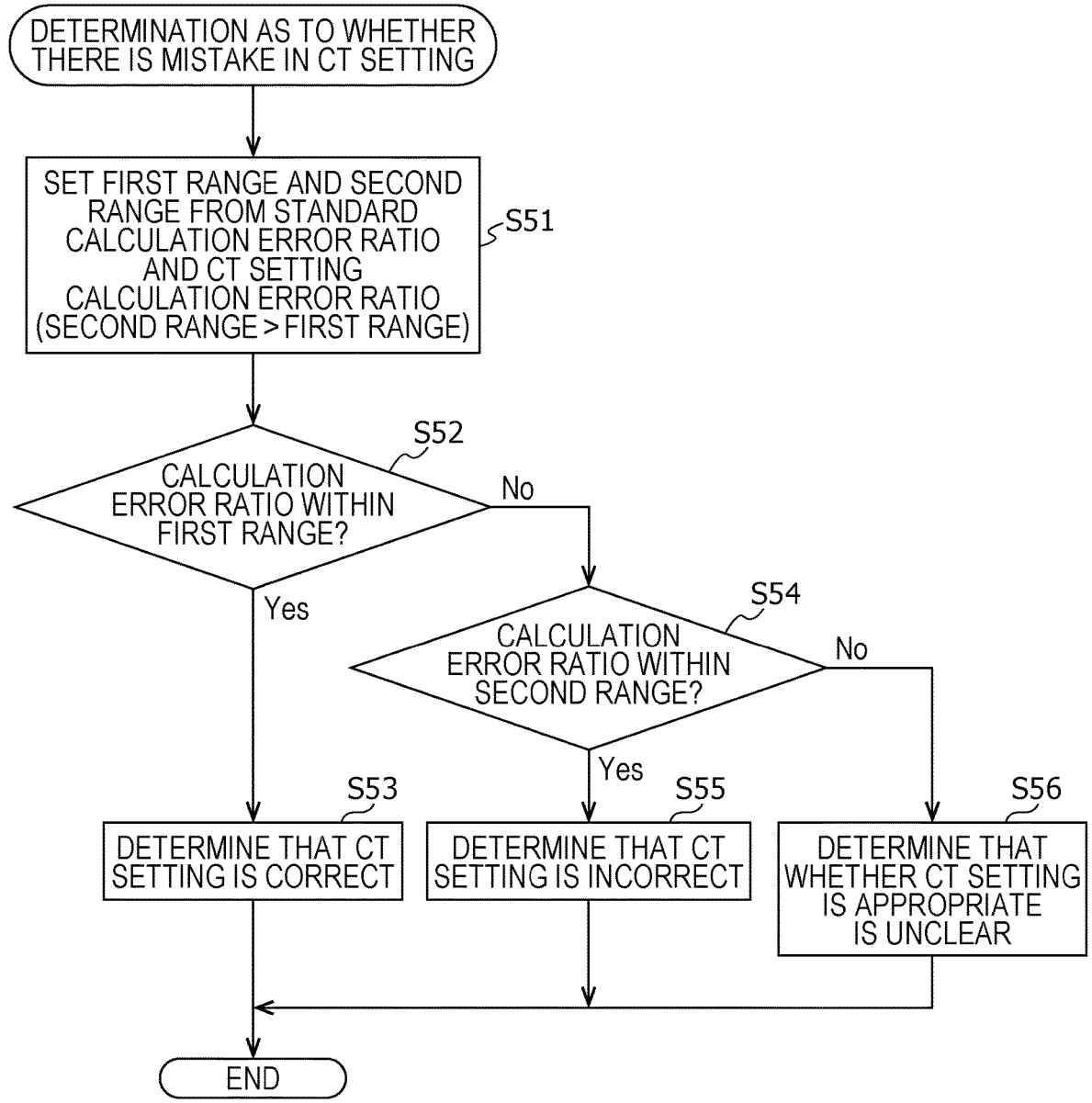
FIG. 13 is a flowchart illustrating an operation to determine whether there is a mistake in a CT setting.

FIG. 13 is a flowchart illustrating an operation to determine whether there is a mistake in a CT setting.

As illustrated in FIG. 13, from the standard calculation error ratio acquired in step S30 and the CT setting calculation error ratio acquired in step S40, the determining device 35 first determines a range of ratios of calculation error due to CT setting mistakes with the standard calculation error ratio taken into consideration (S51). In this embodiment, the standard calculation error ratio is ±10% and CT setting calculation error ratios are −33% and 50%. As an example, a range of calculation error ratios within which CT settings are correct and a range of calculation error ratios within which CT settings are incorrect will be calculated. The range of calculation error ratios within which CT settings are correct is an example of a first range. The range of calculation error ratios within which CT settings are incorrect is an example of a second range. Now, the first range and second range will be described with reference to FIG. 14.

Figure 14:
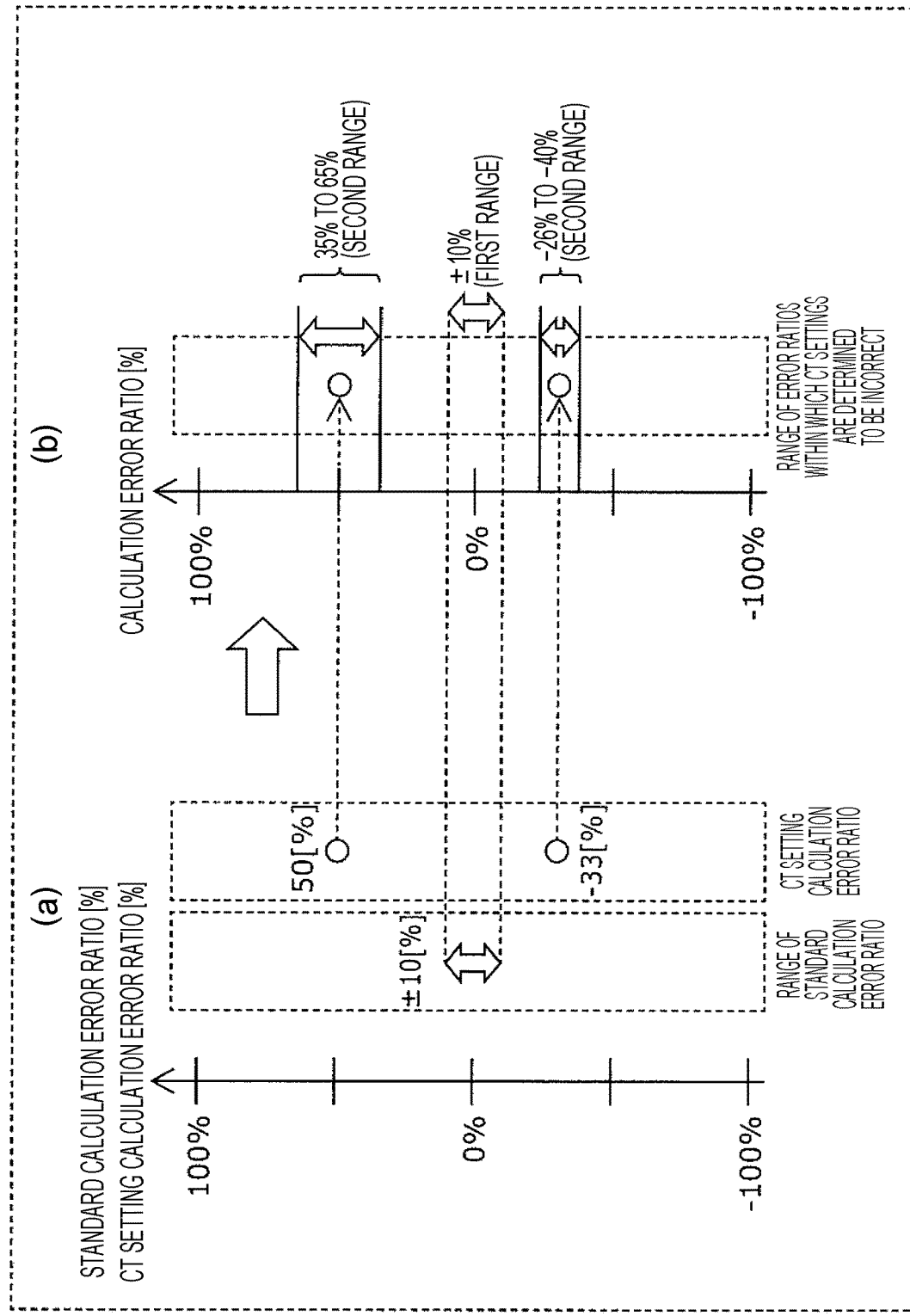
FIG. 14 illustrates an example of a first range and second range.

FIG. 14 illustrates an example of the first range and second range. Specifically, FIG. 14(a) illustrates the range of the standard calculation error ratio and CT setting calculation error ratios. FIG. 14(b) illustrates the first range and second range determined from the standard calculation error ratio and CT setting calculation error ratios.

In FIG. 14(a), the standard calculation error ratio acquired in step S30 and the CT setting calculation error ratios acquired in step S40 are illustrated. In FIG. 14(b), the first range determined from the standard calculation error ratio and the second range determined from the standard calculation error ratio and CT setting calculation error ratios are illustrated.

In this embodiment, the range of the standard calculation error ratio is applied without alternation as the first range. In other words, the first range is set by a simulation method by which the amount of power consumption varying depending on the load is predicted. That is, the first range is set according to the load. In this embodiment, the first range is the range of ±10%, which is the standard calculation error ratio in the simulation method by which the amount of electric power to be consumed by the cooling type is predicted.

In this embodiment, the range of CT setting calculation error ratios with the standard calculation error ratio taken into consideration is applied as the second range. As described above, the first range is the range of error ratios that may be generated by the simulation method by which a predicted value has been calculated. That is, the first range is the range of error ratios generated in the calculation of a predicted value for the amount of power consumption by a simulation, regardless of whether the CT setting is correct or incorrect. Even when, for example, a CT setting is correct, a calculation error ratio calculated from a predicted value and measured value may have error within a range in which the calculation error ratio falls in the first range. This error may be generated in a case as well in which a CT setting includes a mistake. In view of this, the second range is determined with the standard calculation error ratio taken into consideration for the CT setting calculation error ratio. When, for example, the CT setting calculation error ratio is 50%, that is, the predicted value is 1.5 times the measured value, ±15% derived by multiplying (standard calculation error ratio±10%) by 1.5 is applied as a tolerance according to the CT setting calculation error ratio. Thus, 50%±15% is the CT setting calculation error ratio with the standard calculation error ratio taken into consideration. When the CT setting calculation error ratio is −33%, that is, the predicted value is about 0.67 times the measured value, 7% derived by multiplying (standard calculation error ratio±10%) by about 0.67 is applied as a tolerance according to the CT setting calculation error ratio. Thus, −33%±7% is the CT setting calculation error ratio with the standard calculation error ratio taken into consideration. That is, the second range is set in accordance with the CT setting calculation error ratio calculated from a setting mistake pattern for a CT setting and to the standard calculation error ratio set for the load.

It suffices to set the first range and second range so that they do not overlap. That is, it suffices to calculate a predicted value by a simulation method having a standard calculation error ratio that prevents the first range and second range from overlapping. An error ratio in the second range is larger than in the first range. A large error ratio indicates that the absolute value of the error ratio is large.

The second range may be set without considering the standard calculation error ratio. For example, the second range may be set by considering, for the CT setting calculation error ratio, a preset tolerance. In this case, the second range is set in accordance with the CT setting calculation error ratio calculated from a setting mistake pattern for a CT setting.

After the first range and second range have been determined in step S51, the determining device 35 determines whether the calculation error ratio calculated from the predicted value and measured value in step S20 is within the first range (S52). When the calculation error ratio is within the first range (the result in S52 is Yes), that is, the calculation error ratio is within ±10%, the determining device 35 determines that the CT setting set in the watt-hour meter 20 is correct (S53). In other words, the determining device 35 determines that the calculation error ratio calculated in step S20 is not a ratio of error generated due to a CT setting mistake but is a ratio of error generated in the simulation method.

When the determining device 35 determines that the calculation error ratio calculated from the predicted value and measured value in step S20 is outside the first range (the result in S52 is No), that is, the calculation error ratio is larger than ±10%, step S54 is executed. In step S54, the determining device 35 determines whether the calculation error ratio is within the second range. When the calculation error ratio is within the second range, that is, the calculation error ratio is within 50%±15% or within −33%±7% (the result in S54 is Yes), the determining device 35 determines that the CT setting set in the watt-hour meter 20 is incorrect (S55). In other words, the determining device 35 determines that the calculation error ratio calculated in step S20 is not a ratio of error generated in the simulation method but is a ratio of error generated due to a CT setting mistake.

A determination for a calculation error ratio calculated from, for example, the predicted amount of electric power and the calculated amount of electric power illustrated in FIG. 8 will be described with reference to FIG. 15.

Figure 15:
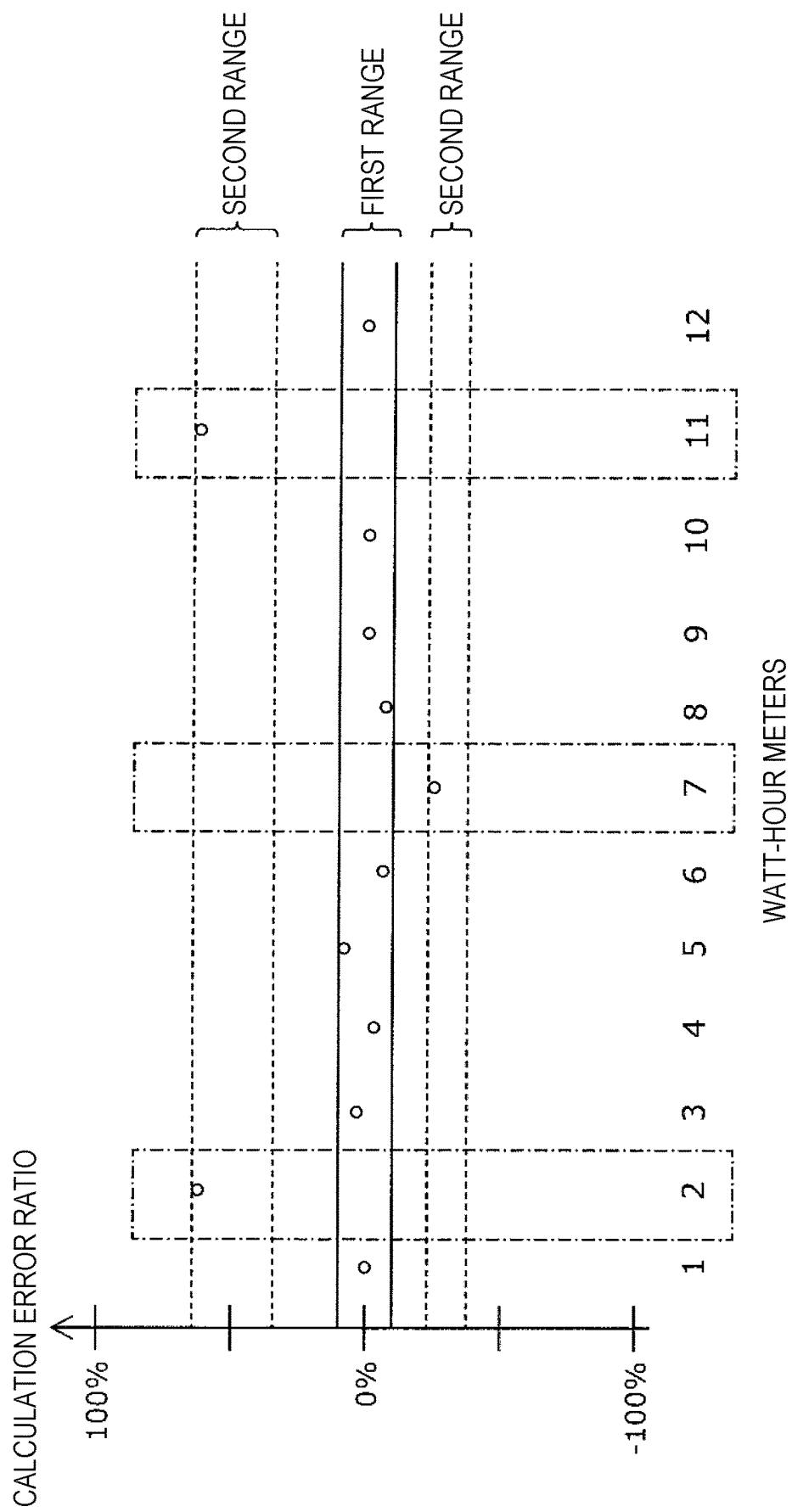
FIG. 15 illustrates how a determination is made from a calculation error ratio as to whether a CT setting is appropriate.

FIG. 15 illustrates how a determination is made from a calculation error ratio calculated in step S20 as to whether a CT setting is appropriate.

As illustrated in FIG. 15, for each of the 12 watt-hour meters numbered 1 to 12, a determination is made from a calculation error ratio as to whether a CT setting is appropriate. The calculation error ratios in FIG. 15 have been calculated by using the predicted amounts of electric power and the calculated amounts of electric power in FIG. 8. The first range and second range calculated in step S51 are also indicated in FIG. 15. As described above, the determining device 35 determines that the CT setting is appropriate when the calculation error ratio is within the first range and that the CT setting is inappropriate when the calculation error ratio is within the second range.

As illustrated in FIG. 15, the calculation error ratios for the watt-hour meters 2, 7, and 11 are within the second range, and the calculation error ratios for the other watt-hour meters are within the first range. In this case, the determining device 35 determines that the CT settings in the watt-hour meters 2, 7, and 11 are inappropriate.

When the calculation error ratio is outside the second range (the result in S54 is No), the determining device 35 determines that whether the CT setting is appropriate is unclear (S56). In this case, error may have been generated due to a factor other than the simulation method and a CT setting mistake or to a combination of a CT setting mistake and another factor. For example, a possible cause is that information about the watt-hour meter 20 and load does not match the actual situation.

Referring again to FIG. 5, after a determination has been made in step S50 as whether there is a mistake in the CT setting, a determination is made as to whether the determination in step S50 has been made for all the watt-hour meters 20 (S60). When, for example, the determining device 35 determines that the determination in step S50 has been made for all the watt-hour meters 20 (the result in S60 is Yes), the control device 33 displays, on the display device 37, the determination result of the determination made by the determining device 35 (S70). Specifically, on the display device 37, the control device 33 displays, when the CT setting is appropriate, information indicating that the CT setting is appropriate, and, when the CT setting is inappropriate, information indicating that the CT setting is inappropriate, as the determination result. Determination results displayed on the display device 37 by the control device 33 will be described with reference to FIG. 16.

FIG. 16 illustrates an example of determination results output to the display device 37 according to this embodiment.

In the example in FIG. 16, for each watt-hour meter 20, ○ is displayed on the display device 37 when the CT setting is correct and x is displayed when the CT setting is incorrect. Although not illustrated, when it is unclear whether the CT setting is appropriate, the control device 33 may display, for example, Δ on the display device 37.

In addition, the control device 33 may display appropriate CT settings for the watt-hour meters 2, 7, and 11, for which it has been determined that an incorrect CT setting had been set, as illustrated in FIG. 16. For example, the control device 33 may display the correct CT setting with reference to information entered in step S10 in relation to the type of the installed CT.

When the determining device 35 determines that the determination in step S50 has not been made for all the watt-hour meters 20 (the result in S60 is No), processing returns to step S20, after which steps S20 to S50 are executed for the remaining watt-hour meters 20.

So far, the determining device 35 has set the first range and second rage and has determined whether a CT setting set in each watt-hour meter 20 is appropriate. However, this is not a limitation. For example, when a calculation error ratio is larger than a threshold, the determining device 35 may determine that the CT setting inappropriate; when the calculation error ratio is smaller than the threshold, the determining device 35 may determine that the CT setting is appropriate. The standard calculation error ratio acquired in step S30, for example, may be used as the threshold. Specifically, the threshold may be ±10%. That is, when the calculation error ratio is at least −10% and at most 10%, the determining device 35 may determine that the CT setting is appropriate; when the calculation error ratio is smaller than −10% or larger than 10%, the determining device 35 may determine that the CT setting inappropriate.

A large calculation error ratio indicates that a difference from 0% is large. That is, a large calculation error ratio indicates that the absolute value of a difference from 0% is large. When, for example, a calculation error ratio of −10% and a calculation error ratio of −20% are compared, −20% has a larger difference from a calculation error ratio of 0%.

In other words, when −10% and −20% are compared, −20% has a larger calculation error ratio.

3. Effects

The determining method, according to this embodiment, by which whether a CT setting is appropriate is determined includes determining whether a setting set in the watt-hour meter 20, the setting according to the current transformation ratio of the current transformer 44, is appropriate, according to a difference between a predicted value for the amount of electric power to be consumed by a load and a measured value for the amount of electric power consumed by the load, the measured value being measured by the watt-hour meter 20.

Thus, it is possible to determine whether the CT setting, which is in accordance with the current transformation ratio of the current transformer 44, is appropriate from a difference between a measured value for the amount of power consumption that has been actually measured and a predicted value, calculated in a simulation, for the amount of power consumption. When, for example, the CT setting is inappropriate, in a case in which it is already found that the measured value and predicted value are close to each other, it can be determined that when the difference is large, the CT setting is inappropriate. That is, just by finding a difference between the measured value and the predicted value, it is possible to determine whether the CT setting entered into the watt-hour meter 20 is appropriate.

When the difference between the predicted value and the measured value is larger than a first threshold, the setting according to the current transformation ratio of the current transformer 44 is determined to be inappropriate. When the difference between the predicted value and the measured value is smaller than the first threshold, the setting according to the current transformation ratio of the current transformer 44 is determined to be appropriate.

Thus, since whether the CT setting is appropriate can be determined according to the difference between the predicted value and the measured value, whether the CT setting is appropriate can be determined more precisely.

When the difference between the predicted value and the measured value is within the first range, the setting according to the current transformation ratio of the current transformer 44 is determined to be appropriate. When the difference between the predicted value and the measured value is within the second range, which indicates that the difference in the second range is larger than in the first range, the setting according to the current transformation ratio of the current transformer 44 is determined to be inappropriate.

Thus, since whether the CT setting is appropriate can be determined according to the difference between the predicted value and the measured value, whether the CT setting is appropriate can be determined more precisely.

The first range is set in accordance with the load.

Thus, the first range is appropriately set for each type of the load. For example, the first range is set in accordance with the simulation method by which the amount of power consumption is predicted, the simulation method varying depending on the type of the load. That is, when the first range is set in accordance with the load, it can be determined whether the calculation error ratio, which is a difference between the predicted value and the measured value, is within error in the simulation method.

The second range is set in accordance with the pattern of a setting mistake in the setting according to the current transformation ratio of the current transformer 44.

Thus, the second range is set in consideration of a difference between the measured value and the predicted value that is taken when a CT setting mistake occurs. When the second range is set according to a CT setting mistake pattern, the determining device 35 can determine whether the calculation error ratio, which is a difference between a predicted value and a measured value, is a ratio of error generated due to a CT setting mistake. When the second range is set in consideration of a difference caused for each CT setting mistake pattern, even when there are a plurality of CT setting mistake patterns, it is possible to determine whether the calculation error ratio is a ratio of error generated due to a CT setting mistake.

Furthermore, the second range is set in accordance with the load as well.

Thus, since the second range can be set in consideration of error in the simulation method by which a predicted value is calculated, it can be determined more precisely that the CT setting is inappropriate.

When the setting according to the current transformation ratio of the current transformer 44 is determined to be inappropriate, a display indicating that the setting is inappropriate is given on the display device 37.

Thus, the user can recognize a watt-hour meter 20 including an inappropriate CT setting just by checking the display device 37.

When the setting according to the current transformation ratio of the current transformer 44 is determined to be inappropriate, an appropriate setting is displayed on the display device 37.

Thus, the user can recognize the correct CT setting just by checking the display device 37.

The CT setting determining apparatus 30 according to this embodiment includes: the predicting device 34 that determines a predicated value for the amount of electric power to be consumed by a load; the acquiring device 32 that acquires a measured value for the amount of electric power consumed by the load, the measured value being measured by the watt-hour meter 20; and the determining device 35 that determines whether a setting set in the watt-hour meter 20, the setting according to the current transformation ratio of the current transformer 44, is appropriate, according to a difference between the predicted value and the measured value.

Thus, the same effect as in the determining method by which whether a CT setting is appropriate is provided.

Other Embodiments

In the above embodiment, an example has been described in which the CT setting determining apparatus 30 acquires, from the watt-hour meter 20 through the acquiring device 32, the amount of electric power measured by the watt-hour meter 20 via wireless communication. However, this is not a limitation. When, for example, the CT setting determining apparatus 30 is placed in a store in which the watt-hour meter 20 is placed, the CT setting determining apparatus 30 may perform wired communication to acquire the amount of electric power from the watt-hour meter 20. When the CT setting determining apparatus 30 performs wired communication to acquire the amount of electric power, an interface included in the CT setting determining apparatus 30 so as to connect to, for example, a local area network (LAN) works as an acquiring device.

In the above embodiment, an example has been described in which only one load is connected to a single watt-hour meter 20. However, this is not a limitation. A plurality of loads may be connected to a single watt-hour meter 20. That is, the watt-hour meter 20 may measures the amount of electric power consumed by a plurality of loads. For example, a plurality of cooling types may be connected to a single watt-hour meter 20. Alternatively, a plurality of different types of loads may be connected to a single watt-hour meter 20.

In the above example, the calculation error ratio has been described as an example of a difference between a predicted value and a measured value. However, this is not a limitation. A difference only needs to be quantitatively indicated from a predicted value and measured value. For example, a difference may be a difference between a predicted value and a measured value or may be another value.

The sequence of a plurality of processes in the determining method described in the above embodiment is only an example. The sequence of the plurality of processes may be changed. Alternatively, the plurality of processes may be concurrently executed.

It should be noted that these general or specific aspects may be implemented as a system, as a determining device, an integrated circuit, a computer program, a computer-readable non-transitory recording medium such as a compact disc-read-only memory (CD-ROM), or any selective combination thereof.

So far, a determining method and a determining apparatus by which whether a CT setting set in the watt-hour meter 20 according to one or a plurality of aspects of the present disclosure is appropriate have been described based on an embodiment. However, the present disclosure is not limited to this embodiment. The range of one or a plurality of aspects of the present disclosure may include embodiments in which various variations that a person having ordinary skill in the art thinks of are applied to the embodiments described above and may also include embodiments in which constituent elements in different embodiments are combined, without departing from the intended scope of the present disclosure.

The present disclosure is useful as, for example, a determining method and a determining apparatus that determine whether a CT setting set in a watt-hour meter that uses a CT is appropriate.

What is claimed is:

1. A determining method comprising:
   determining a predicted power consumption, by predicting an amount of electric power to be consumed by a load in a time period through a simulation;
   acquiring a measured power consumption, indicating an amount of electric power consumed by the load measured by a watt-hour meter, the watt-hour meter including a current transformer, in which a setting value defining a current transformation ratio of the current transformer is set;
   determining a difference between the predicted power consumption and the measured power consumption; and
   determining whether or not the setting value set in the watt-hour meter is appropriate, according to the difference between the predicted power consumption and the measured power consumption.

2. The determining method according to claim 1, wherein:
   when the difference between the predicted power consumption and the measured power consumption is larger than a threshold, the setting value is determined to be inappropriate; and
   when the difference is smaller than the threshold, the setting value is determined to be appropriate.

3. The determining method according to claim 1, wherein:
   when the difference between the predicted power consumption and the measured power consumption is within a first range, the setting value is determined to be appropriate; and
   when the difference is within a second range, which indicates that the difference in the second range is larger than in the first range, the setting value is determined to be inappropriate.

4. The determining method according to claim 3, wherein the first range is set in accordance with the load.

5. The determining method according to claim 3, wherein the second range is set in accordance with a pattern of a setting mistake in the setting value.

6. The determining method according to claim 5, wherein the second range is set in accordance with the load as well as the pattern of the setting mistake.

7. The determining method according to claim 1, wherein when the setting value is determined to be inappropriate, a display image indicating that the setting value is inappropriate is displayed on a display.

8. The determining method according to claim 1, wherein when the setting value is determined to be inappropriate, an appropriate setting value is displayed on a display.

9. A determining apparatus comprising:
   a memory that stores instructions:
   a processor, when executing the instructions stored in the memory, that performs operations including:
   determining a predicated power consumption, by predicting an amount of electric power to be consumed by a load in a time period through a simulation;
   acquiring a measured power consumption, indicating an amount of electric power consumed by the load measured by a watt-hour meter, the watt-hour meter including a current transformer, in which a setting value defining a current transformation ratio of the current transformer is set;
   determining a difference between the predicted power consumption and the measured power consumption; and
   determining whether or not the setting value set in the watt-hour meter is appropriate, according to the difference between the predicted consumption and the measured consumption.

* * * * *